United States Patent [19]

Tokura et al.

[11] Patent Number: 5,519,245

[45] Date of Patent: May 21, 1996

[54] INSULATED GATE BIPOLAR TRANSISTOR WITH REVERSE CONDUCTING CURRENT

[75] Inventors: Norihito Tokura, Okazaki; Naoto Okabe, Chita; Naohito Kato, Kariya, all of Japan

[73] Assignee: Nippondenso Co., Ltd., Kariya, Japan

[21] Appl. No.: 56,946

[22] Filed: May 5, 1993

Related U.S. Application Data

[63] Continuation of Ser. No. 678,312, filed as PCT/JP90/01091, Aug. 29, 1990, abandoned.

[30] Foreign Application Priority Data

Aug. 31, 1989 [JP] Japan .................................. 1-226262

[51] Int. Cl.⁶ ........................... H01L 29/80; H01L 29/76; H01L 23/58; H01L 29/861
[52] U.S. Cl. ........................ 257/376; 257/263; 257/372; 257/495; 257/605
[58] Field of Search .................................. 357/35, 37, 38; 257/262, 372, 373, 376, 494, 495, 605, 263

[56] References Cited

U.S. PATENT DOCUMENTS

| | | | |
|---|---|---|---|
| 4,003,072 | 1/1977 | Matsushita et al. | 257/495 |
| 4,400,716 | 8/1983 | Tani et al. | 257/495 |
| 4,654,688 | 3/1987 | Fukushima | 357/38 |
| 4,689,647 | 8/1987 | Nakagawa et al. | 257/143 |
| 4,754,315 | 6/1988 | Fisher et al. | 357/38 |
| 4,821,095 | 4/1989 | Temple | 357/38 |
| 4,841,350 | 6/1989 | Nishizawa | 357/38 |
| 4,857,983 | 8/1989 | Baliga et al. | 357/38 |
| 4,866,500 | 9/1989 | Nishizawa et al. | 357/38 |
| 5,017,991 | 5/1991 | Nishizawa et al. | 357/38 |
| 5,021,855 | 6/1991 | Oikawa et al. | 357/38 |
| 5,027,180 | 6/1991 | Nishizawa et al. | 357/38 |
| 5,223,919 | 6/1993 | Whight et al. | 257/494 |

FOREIGN PATENT DOCUMENTS

| | | |
|---|---|---|
| 0338312 | 10/1989 | European Pat. Off. . |
| 0380249 | 8/1990 | European Pat. Off. . |
| 61-15370 | 1/1986 | Japan . |
| 61-158177 | 7/1986 | Japan .................................. 257/495 |
| 61-185971 | 8/1986 | Japan . |
| 61-216363 | 9/1986 | Japan . |
| 61-208268 | 9/1986 | Japan . |
| 62-174971 | 7/1987 | Japan .................................. 357/38 |
| 62-219667 | 9/1987 | Japan . |
| 63-081861 | 4/1988 | Japan . |
| 63-150970 | 6/1988 | Japan . |
| 63-186475 | 8/1988 | Japan . |
| 0109769 | 4/1989 | Japan . |
| 1129462 | 5/1989 | Japan . |

OTHER PUBLICATIONS

T. P. Chow, et al, "P–Channel, Vertical Insulated Gate Bipolar Transistors with Collector Short", IEEE, Dec. 1987, pp. 670–673, IEDM 1987.

A New Injection Suppression Structure for conductivity Modulated Power MOSFETs UEDA, Daisuke et al pp. 97–100, 1986, Conference on Solid State Devices.

*Primary Examiner*—Mahshid Saadat
*Attorney, Agent, or Firm*—Cushman, Darby & Cushman

[57] ABSTRACT

An insulated gate bipolar transistor has a reverse conducting function built therein. A semiconductor layer of a first conduction type is formed on the side of a drain, a semiconductor layer of a second conduction type for causing conductivity modulation upon carrier injection is formed on the semiconductor layer of the first conduction type, a semiconductor layer of the second conduction type for taking out a reverse conducting current opposite in direction to a drain current is formed in the semiconductor layer of the second conduction type which is electrically connected to a drain electrode, and a semiconductor layer of the second conduction type is formed at or in the vicinity of a pn junction, through which carriers are given and received to cause conductivity modulation, with a high impurity concentration resulting in a path for the reverse conducting current into a pattern not impeding the passage of the carriers. Therefore, the built-in reverse conducting function has a low operating resistance, a large reverse current can be passed, there is no increase in on-resistance, and the turn-off time can be shortened.

37 Claims, 8 Drawing Sheets

INSULATED GATE BIPOLAR TRANSISTOR WITH REVERSE CONDUCTING CURRENT

TECHNICAL FIELD

This is a continuation of application Ser. No. 07/678,312, filed as PCT/JP90/01091, Aug. 29, 1990, which was abandoned upon the filing hereof.

This invention relates to an insulated gate bipolar transistor having a reverse conducting function built therein.

BACKGROUND ART

Recently, attention has been paid to insulated gate bipolar transistors (referred to as IGBT) as shown in FIG. 14 that are usable as power elements for which high withstand voltage and low on-resistance are required.

Since this type of transistor has a $p^+$ layer on the side of a drain D, a low on-resistance is attained; but, its turn-off time is long as compared with a usual power MOSFET.

Generally, power switching elements of this type are used as switches of power converting units such as inverters, to which reverse conducting diodes are connected in parallel. As pointed out in Japanese Patent Laid-Open No. 61-15370, the usual power MOSFET has the reverse conducting diode built therein; but, the IGBT has no built-in diode, thus must have such a reverse conducting diode connected externally.

In view of the foregoing problems, Japanese Patent Laid-Open No. 61-15370, for example, has proposed a configuration as shown in FIG. 15. In this drawing, a portion of a $p^+$ layer 11 on the side of the drain (corresponding to a reverse conducting diode region 5 as shown) is replaced with an $n^+$ layer 11N of the opposite conduction type so that a reverse conducting diode is built in integrally. Further, an $n^+$ layer 25 is formed for restricting the injection of positive holes from the $p^+$ layer 11 on the side of the drain without affecting the on-resistance appreciably, whereby the lifetime of carriers in an $n^-$ drain layer 12 is decreased, thereby shortening the turn-off time.

In fact, by virtue of the $n^+$ layer 25 disposed between the $p^+$ layer 11 and the $n^-$ drain layer 12, the efficiency of injection of positive holes from the $p^+$ layer 11 into the $n^-$ drain layer 12 is decreased. However, since the whole current flowing through an $n^+$ source layer 14 and the $p^+$ layer 11 is given by the sum of electrons and positive holes, the foregoing decrease in the efficiency of injection of positive holes results in a decrease in the current of positive holes which forms part of the whole current, that is, the amount of minority carrier (positive hole) accumulated in the $n^-$ drain layer 12 decreases, and the amount of positive hole contributing to conductivity modulation in the $n^-$ drain layer 12 also decreases; as a result, the on-resistance increases inevitably.

Another configuration is shown in FIG. 16 has also been proposed (see "Extended Abstract of the 18th Conference on Solid State Devices and Materials", Tokyo, 1986, pp. 97–100) which is characterized in that an $n^+$ region 26 is formed in a marginal surface portion of an IGBT element, and this $n^+$ region 26 is electrically connected to a drain electrode 22, whereby the injection of minority carrier (positive hole) into the $n^-$ layer 12 is restricted, thereby shortening the turn-off time of the IGBT.

In this second configuration, a reverse conducting diode is virtually or parasitically built in wherein a reverse conducting current flows through the path defined by a source electrode 18, p layer 13, $n^-$ layer 12, $n^+$ layer 26, external wire 34', and drain electrode 22 in that order. However, the lateral resistance of the $n^-$ layer 12 is high especially when the IGBT is designed to exhibit a high withstand voltage. Accordingly, even if it were tried to attain the reverse conducting function by the use of the foregoing path, the resultant operating resistance is high thus, the reverse conducting diode seeming to be built in cannot function practically as required.

The present invention has been devised in view of the foregoing various problems, thus its object is to provide an insulated gate bipolar transistor (IGBT) having a reverse conducting function of low operating resistance built therein, whose turn-off time is short and whose on-resistance is low.

DISCLOSURE OF THE INVENTION

To accomplish the foregoing object, in an insulated gate bipolar transistor according to the present invention, a first semiconductor layer of a first conduction type is formed on the side of a drain, a second semiconductor layer of a second conduction type for causing conductivity modulation upon carrier injection is formed on the first semiconductor layer, a third semiconductor layer of the first conduction type is selectively formed on the surface of the second semiconductor layer, a fourth semiconductor layer of the second conduction type is selectively formed on the surface of the third semiconductor layer, a gate electrode is formed on the surface of the third semiconductor layer between the second semiconductor layer and the fourth semiconductor layer with a gate insulating film interposed between them, a source electrode is formed as to spread from the surface of the third semiconductor layer to the surface of the fourth semiconductor layer, and a drain electrode for supply of a drain current is formed on the side of the drain.

In the foregoing configuration, a fifth semiconductor layer of the second conduction type for passing therethrough a reverse conducting current opposite in direction to the drain current is formed in a given region within the second semiconductor layer which is electrically connected to the drain electrode, and a sixth semiconductor layer of the second conduction type is formed at or in the vicinity of the interface between the first semiconductor layer and the second semiconductor layer with an impurity concentration higher than that of the second semiconductor layer into a given pattern such that a region for passage of carriers is left to decrease the electric resistance between the fifth semiconductor layer and a region of the second semiconductor layer that is spaced apart from the fifth semiconductor layer and to allow the carriers to be given and received between the first semiconductor layer and the second semiconductor layer, whereby a reverse conducting function is provided.

Specifically, by providing the fifth semiconductor layer and electrically connecting the fifth semiconductor layer to the drain electrode using a conductor, there are formed a pn junction diode composed of the second and third semiconductor layers and a transistor (referred to as a reverse transistor) whose emitter, base and collector correspond to the third, second and first semiconductor layers, respectively, whereby the reverse conducting function is provided. Further, by forming the sixth semiconductor layer of the same conduction type as of the second semiconductor layer with an impurity concentration higher than that of the second semiconductor layer, the operating resistance of the reverse conducting function is decreased by virtue of the sixth semiconductor layer. That is, the sixth semiconductor layer decreases the operating resistance of the pn junction diode and serves as the current path of the pn junction diode. Further, the current flowing through the sixth semiconductor layer becomes the base current of the reverse transistor. Accordingly, a current larger than the base current flows through the collector (the first semiconductor layer) of the reverse transistor and through the drain electrode. Therefore, the operating resistance of the reverse conducting function can be decreased and a large reverse current can be passed through it.

Further, since the second and first semiconductor layers are electrically short-circuited via the sixth and fifth semiconductor layers, excessive majority carriers accumulated in the second semiconductor layer are removed, thereby shortening the turn-off time. In this regard, since the sixth semiconductor layer is formed into a given pattern such that a region for passage of carriers is left to allow the carriers to be given and received between the first semiconductor layer and the second semiconductor layer, the passage of the carriers is not impeded. Therefore, an increase in on-resistance that would be caused if the passage of the carriers were impeded does not occur, whereby the turn-off time can be shortened.

BEST MODE FOR CARRYING OUT THE INVENTION

Embodiments of the present invention will now be described with reference to the drawings.

Figure 1:
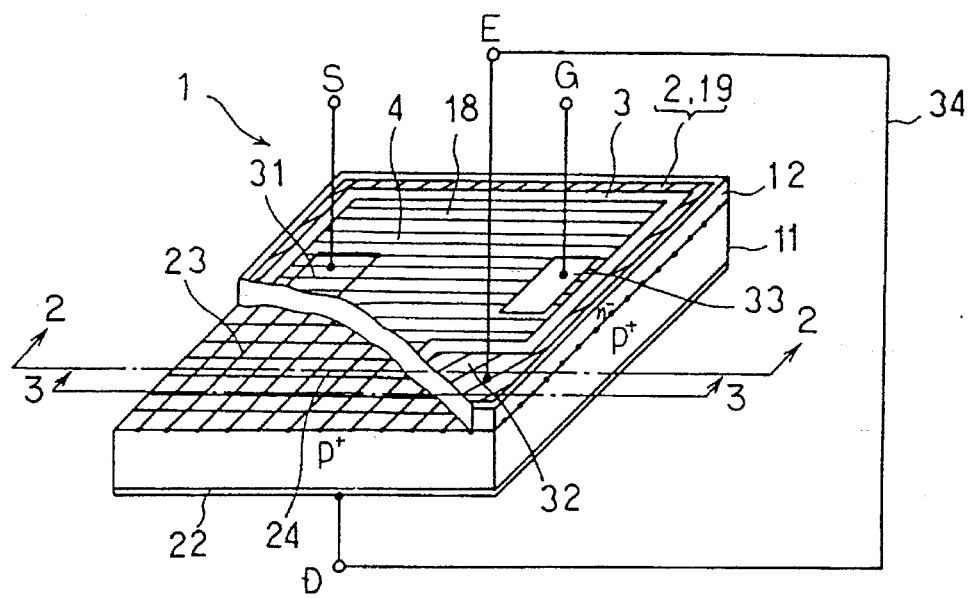
FIG. 1 is a perspective view, with portions broken away, showing a first embodiment of an insulated gate bipolar transistor (IGBT) according to the present invention.
Figure 2:
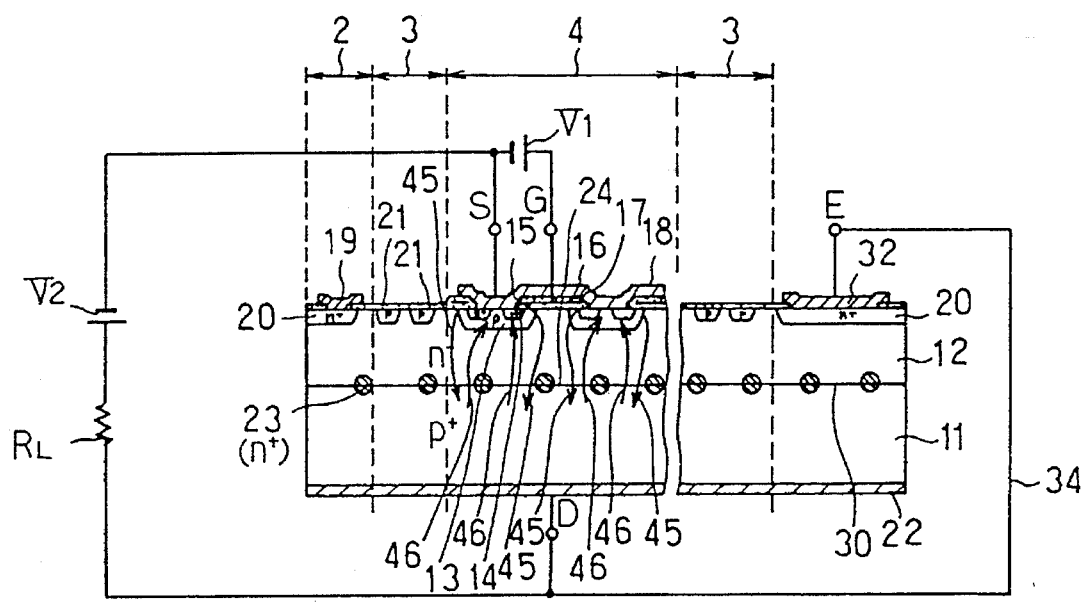
FIG. 2 is a sectional view taken along line A—A in FIG. 1.
Figure 3:
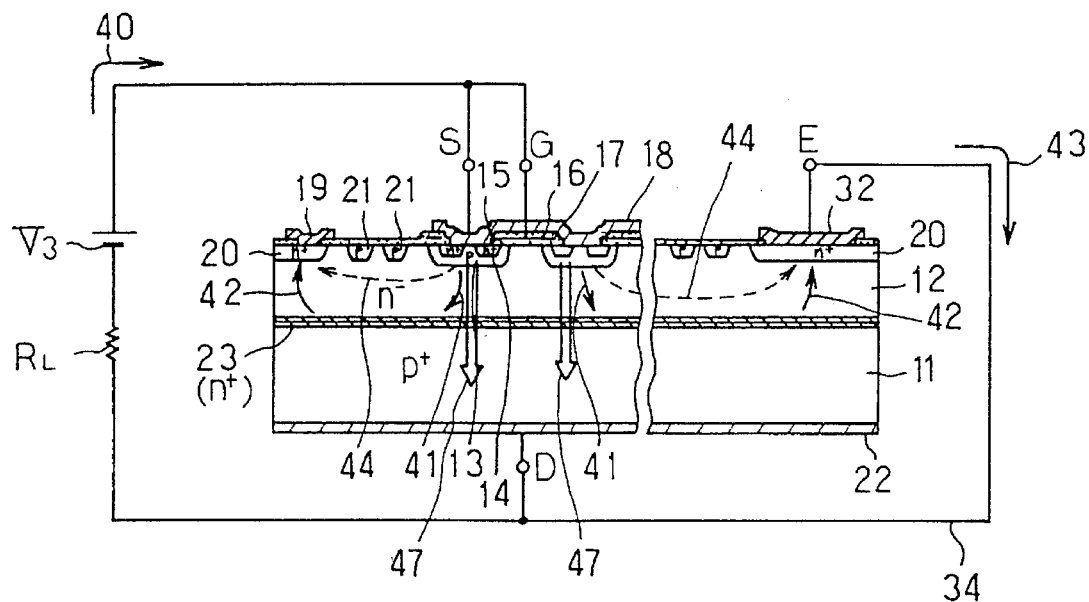
FIG. 3 is a sectional view taken along line B—B in FIG. 1.

FIG. 1 is a perspective view showing a first embodiment of an insulated gate bipolar transistor (IGBT) according to the present invention. FIGS. 2 and 3 are sectional views taken along line A—A and line B—B, respectively, in FIG. 1. The process of manufacturing the IGBT will be described.

First, a semiconductor substrate is prepared having a $p^+$ layer 11 (a first semiconductor layer), and impurities are selectively diffused into the surface of the substrate to form an $n^+$ layer 23 of mesh pattern. Then, an $n^-$ layer 12 (a second semiconductor layer) is formed by the vapor growth technique on the surface of the $p^+$ layer 11 (where the $n^+$ layer 23 is present) as to have an impurity concentration enough to realize a predetermined withstand voltage, this $n^-$ layer 12 changing the $n^+$ layer 23 into the form of an embedded layer.

Then, a p layer 13 (a third semiconductor layer) and another p layer 21 are concurrently formed to a depth of 3–6 μm by the selective diffusion technique. This p layer 21 called a guard ring is provided for the purpose of ensuring a high withstand voltage. Further, an $n^+$ layer 14 (a fourth semiconductor layer) and another $n^+$ layer 20 are concurrently formed in the p layer 13 and in a marginal portion of the element, respectively, by the selective diffusion technique. Here, the $n^+$ layer 14 serves as a source, and the $n^+$ layer 20 serves as the cathode of a pn junction diode (referred to as a reverse conducting diode) composed of the p layer 13 and $n^-$ layer 12, as will be described later.

In the foregoing manufacturing process, the p layer 13 and the $n^+$ layer 14 are formed in self alignment manner by the so-called DSA (diffusion self alignment) technique, using a gate electrode 16 as a mask which is formed on a gate oxide film 15 formed by oxidizing the surface of the $n^-$ layer 12; as a result, there is provided a channel.

Then, an interlayer insulating film 17 is formed, and for the purpose of providing ohmic contact for the p layer 13, $n^+$ layer 14 and $n^+$ layer 20, contact openings are formed in the gate oxide film 15 and the interlayer insulating film 17, aluminum is deposited to a thickness of a few μm, and selective etching is performed to form a source electrode 18, a source terminal 31, s gate terminal 33, a reverse conducting electrode 19, and a reverse conducting terminal 32.

Then, a metallic film is deposited on the back side of the $p^+$ layer 11 to form a drain electrode 22, and an external conductor 34 is connected to the reverse conducting terminal 32 and the drain electrode 22, whereby an IGBT 1 is completed as shown in FIGS. 1 through 3. The IGBT 1 is composed fundamentally of an element region 4, a high-voltage withstand region 3, and a marginal region 2, as shown in FIGS. 1 through 3.

The operation of the foregoing configuration will be described.

The reverse characteristic or reverse conducting function of the IGBT 1 shown in FIG. 1 will be described with reference to FIG. 3. To explain the operation of the reverse conducting state, in FIG. 3, a power source $V_3$ and a load resistor $R_L$ are connected between the source electrode 18 and the drain electrode 22 such that positive and negative potentials are applied to the source electrode 18 and the drain electrode 22, respectively.

In the foregoing configuration, a reverse conducting current flows through two paths: the reverse conducting diode composed of the p layer 13 and $n^-$ layer 12; and a reverse transistor whose emitter, base and collector correspond to the p layer 13, $n^-$ layer 12 and $p^+$ layer 11, respectively.

Specifically, in the reverse conducting diode, the reverse conducting current flows through the path indicated by the arrows 40 through 43 in FIG. 3, or the path defined by the positive plate of the source $V_3$, source electrode 18, p layer 13, $n^-$ layer 12, $n^+$ embedded layer 23, $n^-$ layer 12, $n^+$ layer 20, reverse conducting electrode 19 and reverse conducting terminal 32, external conductor 34, drain electrode 22, load resistor $R_L$, and negative plate of the source $V_3$ in that order.

In the foregoing path, the forward characteristic of the reverse conducting diode of the IGBT 1 is determined by the electrical characteristic of the pn junction composed of the p layer 13 and $n^-$ layer 12, and the operating resistance determined by the path defined by the p layer 13, $n^-$ layer 12 (arrow 41), $n^+$ embedded layer 23, $n^-$ layer 12 (arrow 42), and $n^+$ layer 20 in that order. That is, the value of operating resistance $R_1$ of the reverse conducting diode is expressed by $$R_1 = R_{10} + R_{11} + R_{12} \qquad (1)$$

where $R_{10}$ is the value of resistance encountered when the current indicated by the arrow 41 flows across the $n^-$ layer 12, $R_{11}$ is the value of resistance encountered when the current flows laterally across the $n^+$ embedded layer 23, and $R_{12}$ is the value of resistance encountered when the current indicated by the arrow 42 flows across the $n^-$ layer 12.

In Expression (1), the $R_{10}$ and $R_{12}$ are low enough. The reason is that even, where the resistivity of the $n^-$ layer 12 is as high as some tens of $\Omega.cm$, the distance of the path indicated by the arrows 41 and 42 is as short as 100 μm at most. Further, the $R_{11}$ is low enough. The reason is that the impurity concentration of the $n^+$ embedded layer 23 is made high so that its resistivity becomes less enough, and the pitch of the mesh pattern of the layer 23 is set fine enough. Accordingly, the value of operating resistance $R_1$ of the reverse conducting diode expressed by Expression (1) is low enough.

On the other hand, in case the $n^+$ embedded layer 23 is not provided, the reverse conducting current flows a long distance through the $n^-$ layer 12 of high resistance as indicated by the arrow 44 in FIG. 3; therefore, the operating resistance of the reverse conducting diode becomes greater.

Now, in the reverse transistor, the reverse conducting current flows through the path indicated by the arrow 47 in FIG. 3, or the path defined by the source electrode 18, p layer 13, $n^-$ layer 12, $p^+$ layer 11, and drain electrode 22 in that order.

In the foregoing path, the forward characteristic of the reverse transistor is determined by the efficiency of injection of positive holes injected from the p layer 13 (corresponding to the emitter) into the $n^-$ layer 12 (corresponding to the base), and the efficiency of transportation of positive holes when they move through the $n^-$ layer 12 (corresponding to the base layer) to the $p^+$ layer 11 (corresponding to the collector), and the product of the injection efficiency and the transportation efficiency determines the forward current gain α of the reverse transistor. Generally, using the current gain α, the ratio of collector current $I_C$ to base current $I_B$ of a transistor is given by $$\frac{I_C}{I_B} = \frac{\alpha}{1-\alpha}$$

and the value α is generally close to one (1); thus, the collector current $I_C$ is greater than the base current $I_B$. In the reverse transistor composed of the p layer 13, $n^-$ layer 12, and $p^+$ layer 11, the base current $I_B$ corresponds to the current flowing through the foregoing reverse conducting diode. Accordingly, a current larger than the above flows as the collector current of the reverse transistor.

As described above, the presence of the $n^+$ embedded layer 23 can decrease not only the operating resistance of the reverse conducting diode but also the operating resistance of the reverse transistor; thus, the operating resistance of the reverse conducting function can be made less by the foregoing multiplicative effect.

Figure 4:
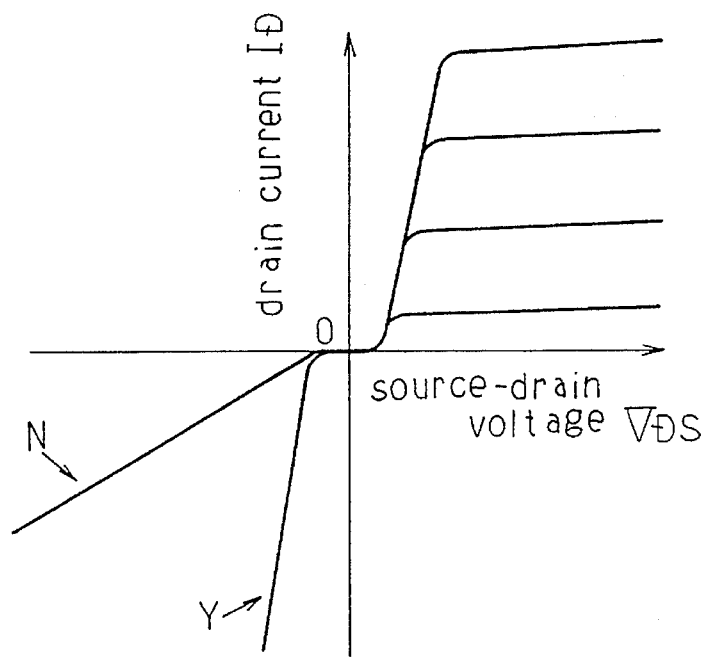
FIG. 4 is a graph showing the electrical characteristic of the IGBT shown in FIG. 1.

FIG. 4 shows the electrical characteristic of the IGBT 1 in which the characteristic curve Y corresponds to the presence of the $n^+$ embedded layer 23 and the characteristic curve N to the absence. The third quadrant of the graph corresponds to the reverse conducting characteristic. As will be clear from FIG. 4, where the $n^+$ embedded layer 23 is present, the operating resistance is low, whereby a large current can be passed.

The forward characteristic of the IGBT 1 shown in FIG. 1 will be described with reference to FIG. 2. To explain the operation of the forward characteristic, in FIG. 2, a power source $V_2$ and a load resistor $R_L$ are connected between the drain electrode 22 and the source electrode 18, and another power source $V_1$ is connected between the gate electrode 16 and the source electrode 18.

In the foregoing configuration, electrons flow along the path indicated by the arrow 45, or through the $n^+$ layer 14, channel, $n^-$ layer 12, mesh portion 24 of the $n^+$ embedded layer 23, and $p^+$ layer 11 in that order. On the other hand, positive holes flow along the path indicated by the arrow 46, or through the $p^+$ layer 11, mesh portion 24 of the $n^+$ embedded layer 23, $n^-$ layer 12, and p layer 13 in that order. That is, in the IGBT 1 having the $n^+$ embedded layer 23, this embodiment makes the $n^+$ embedded layer 23 into the form of a mesh so that electrons and positive holes can pass through the mesh portion 24 of the $n^+$ embedded layer 23. Therefore, by properly setting the pitch of the mesh pattern of the $n^+$ embedded layer 23 such that it less influences the passage of electrons and positive holes as if the $n^+$ embedded layer 23 were not provided as in the prior art, it is possible to attain both high withstand voltage and low on-resistance.

Figure 5:
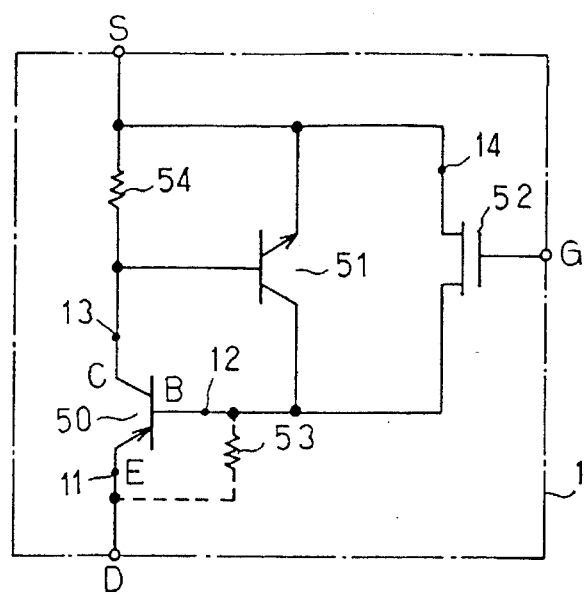
FIG. 5 is a diagram showing the equivalent circuit of the IGBT shown in FIG. 1.

Further, the IGBT 1 shown in FIG. 1 has the reverse conducting function built therein and its turn-off time can be shortened. The reason will be described. The equivalent circuit of the IGBT is shown in FIG. 5. Specifically, the IGBT is composed of a pnp transistor 50, an npn transistor 51, and a MOSFET 52, and a shunt resistor 54 is connected across the base-emitter to make the npn transistor 51 disable in the normal operation. Therefore, the turn-off time of the IGBT is determined by the turn-off time of the pnp transistor 50. The emitter E of the pnp transistor 50 corresponds to the $p^+$ layer 11 shown in FIGS. 1 through 3, the base B to the $n^-$ layer 12, and the collector C to the p layer 13.

It is known that if an adequate resistor is connected across the base-emitter of a bipolar transistor, it removes excessive charge accumulated in the base to shorten the turn-off time. That is, in FIG. 5, when a resistor 53 of low resistance is connected across the base-emitter of the pnp transistor 50, the turn-off time of the pnp transistor is shortened, thereby shortening the turn-off time of the IGBT 1.

Since the base of the pnp transistor 50 corresponds to the $n^-$ layer 12 and the emitter to the $p^+$ layer 11, the value of resistance $R_{53}$ of the resistor 53 shown in FIG. 5 is expressed by $$R_{53} = R_{11} + R_{12} \qquad (2)$$

where $R_{11}$ is the value of resistance encountered when the current flows laterally through the $n^+$ embedded layer 23, $R_{12}$ is the value of resistance between the $n^+$ embedded layer 23 and the $n^+$ layer 20, and they are indentical with the $R_{11}$ and $R_{12}$ included in Expression (1).

As will be clear from FIGS. 2 and 3, the $n^+$ embedded layer 23 spreads over the whole area of a junction surface 30 in the form of a mesh and is in electrical contact with the $n^-$ layer 12. Therefore, the $R_{11}$ and $R_{12}$ included in Expression (2) are less enough; thus, the $R_{53}$ can be made low, the turn-off time of the pnp transistor 50 can be shortened, and the turn-off time of the IGBT 1 can be shortened.

As described above, in this embodiment, since the $n^+$ embedded layer 23 is made in the form of a mesh, the turn-off time can be shortened without degrading the efficiency of injection of positive holes from the $p^+$ layer 11 or increasing the on-resistance, and there is realized the configuration having the reverse conducting function built therein.

Figure 14:
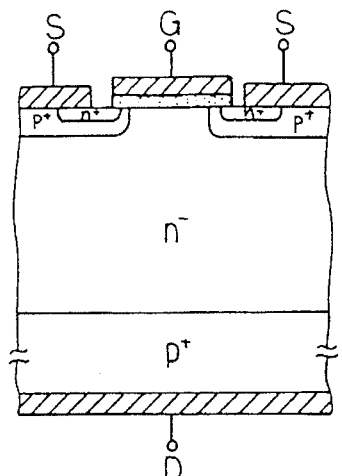
FIG. 14 is a sectional view showing a fundamental IGBT.
Figure 15:
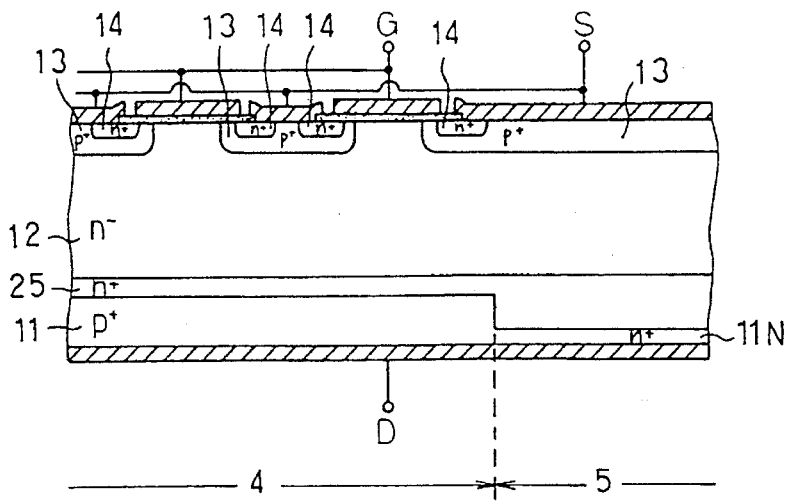
FIGS. 15 and 16 are sectional views showing conventional IGBT's.
Figure 16:
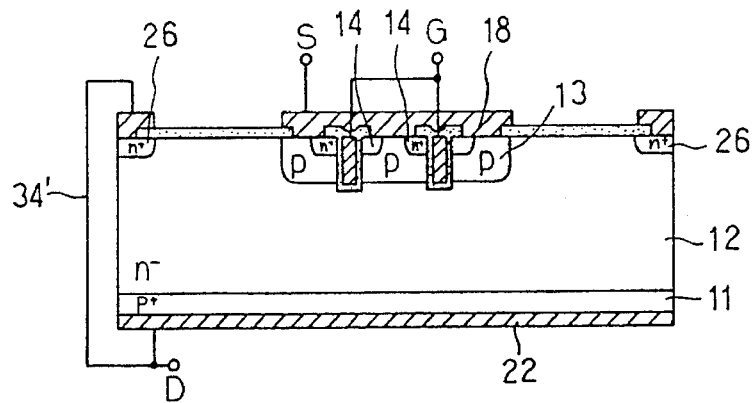

Incidentally, in this embodiment, the $n^+$ layer 20 can be formed concurrently with the $n^+$ layer 14, the $n^+$ embedded layer 23 of mesh pattern can be formed by adding its loaning step to the manufacturing process adopted in obtaining the configuration of FIG. 14 or to a manufacturing process similar to that adopted in obtaining the usual power MOSFET, and it is not necessary to form an $n^+$-type region (serving as the reverse conducting diode region 5) in separated relation to a $p^+$-type region (serving as the element region 4) on the back side of a substrate, as opposed to the configuration of FIG. 15; thus, this embodiment can be implemented without complicating the manufacturing process. In the field of IGBT manufacture, it is known to join substrates of different conduction types together or to directly join wafers together; in this case, the $n^+$ embedded layer of mesh pattern may be previously formed on the surface to be joined of a substrate or wafer.

Figure 6:
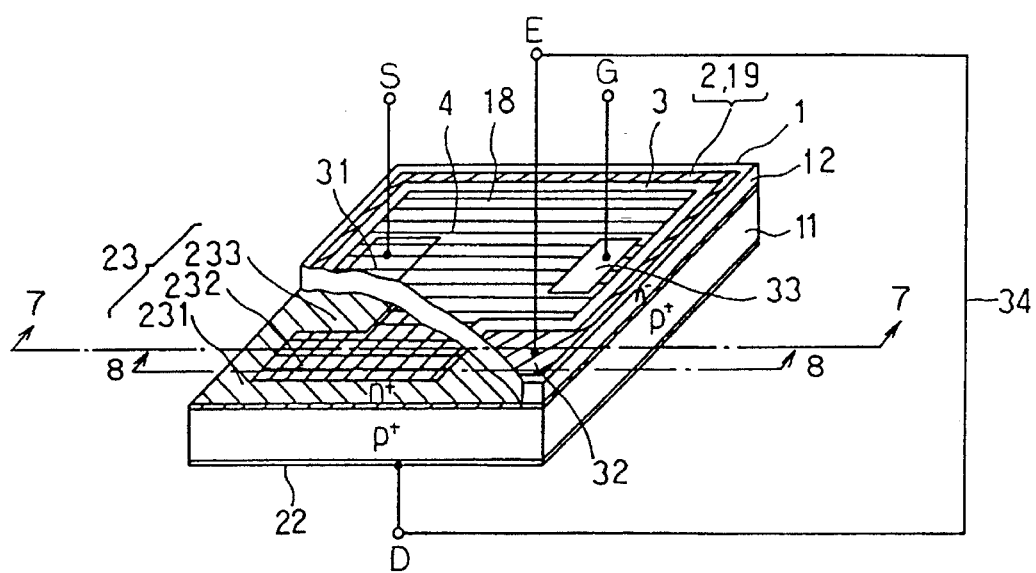
FIG. 6 is a perspective view, with portions broken away, showing a second embodiment of the IGBT according to the present invention.
Figure 7:
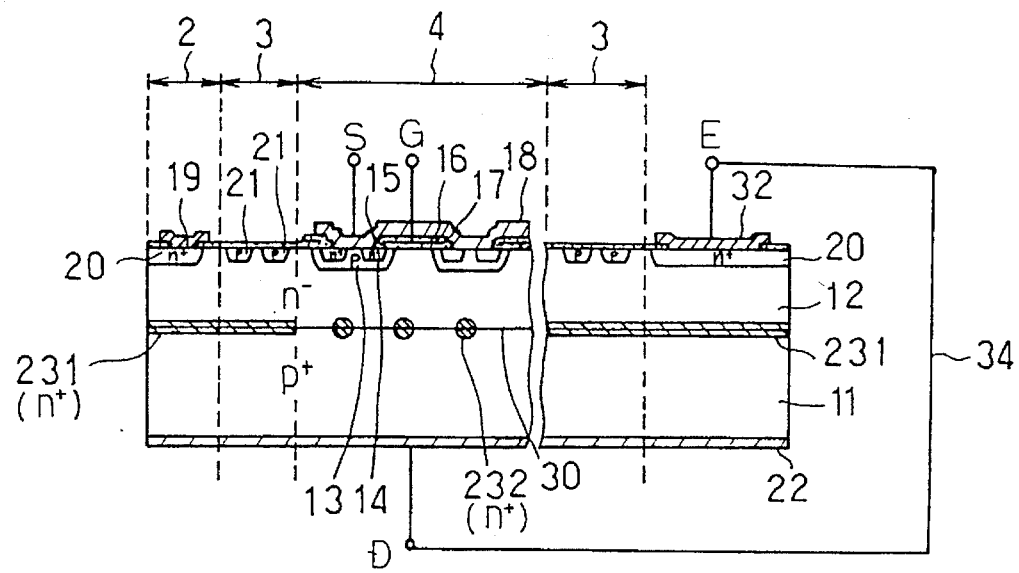
FIG. 7 is a sectional view taken along line A—A in FIG. 6.
Figure 8:
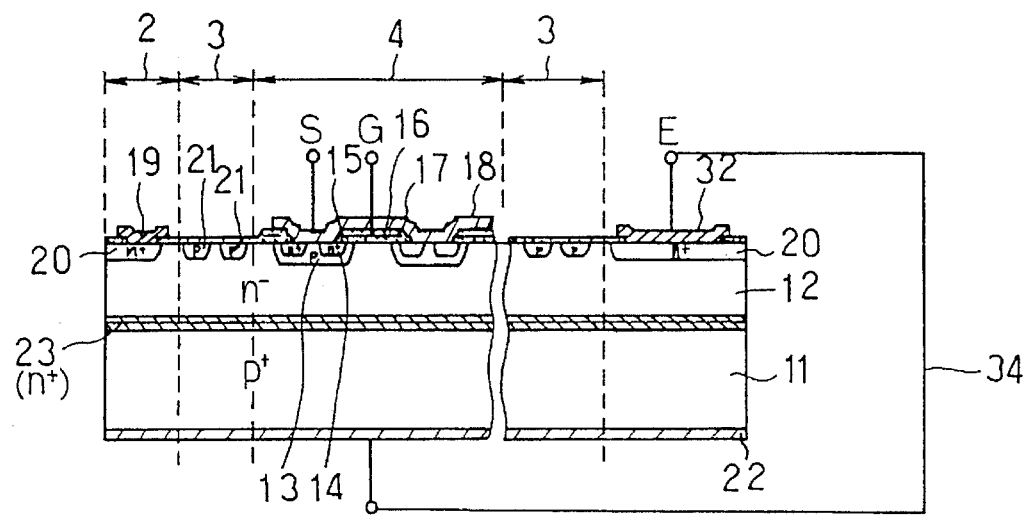
FIG. 8 is a sectional view taken along line B—B in FIG. 6.

FIGS. 6 through 8 show a second embodiment. FIGS. 7 and 8 are sectional views taken along line A—A and line B—B, respectively, in FIG. 6. In these drawings, portions identical with those shown in FIGS. 1 through 3 are designated by the same reference numerals. The configuration of FIGS. 6 through 8 differs from that of FIGS. 1 through 3 in that a portion of the $n^+$ embedded layer 23 is modified. Specifically, portions of the $n^+$ embedded layer 23 which are in confronting relation to the marginal region 2, high-voltage withstand region 3, source terminal 31, and reverse conducting terminal 32, namely, portions of the $n^+$ embedded layer 23 which are not in confronting relation to the element region 4, are uniformly spreading in contrast with the form of a mesh, thereby defining $n^+$ layers 233 and 231.

With the foregoing modification, a portion of the $n^+$ embedded layer 23 which is in confronting relation to the $n^+$ layer 20 becomes large in area; consequently, the value of resistance $R_{12}$ included in Expressions (1) and (2) can be made further low so that the value of operating resistance $R_1$ of the reverse conducting diode of the IGBT 1 can be made further low, and the value of resistnace $R_{53}$ across the base-emitter of the pnp transistor 50 in the equivalent circuit of FIG. 5 can be made further low, whereby the turn-off time can be shortened further.

Figure 9:
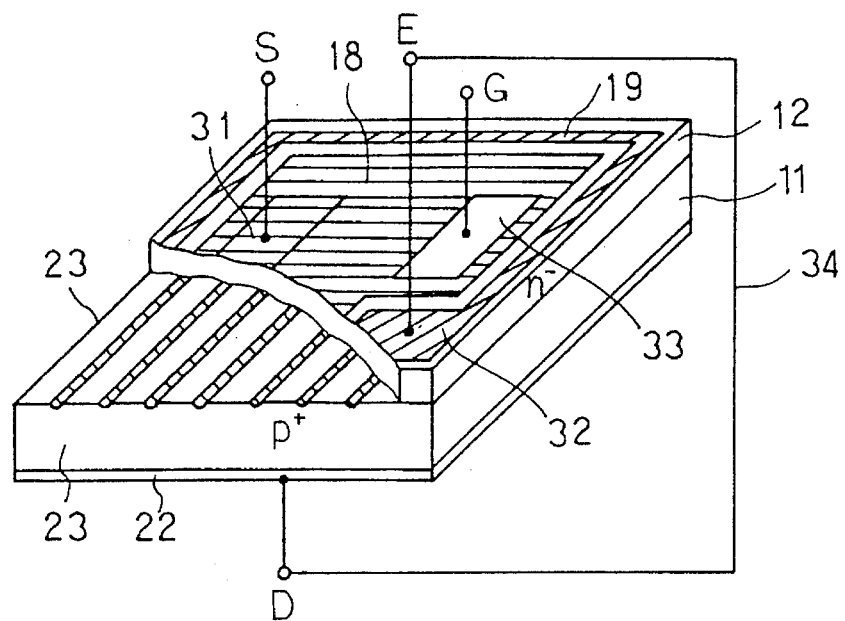
FIG. 9 is a perspective view, with portions broken away, showing a third embodiment of the IGBT according to the present invention.
Figure 10:
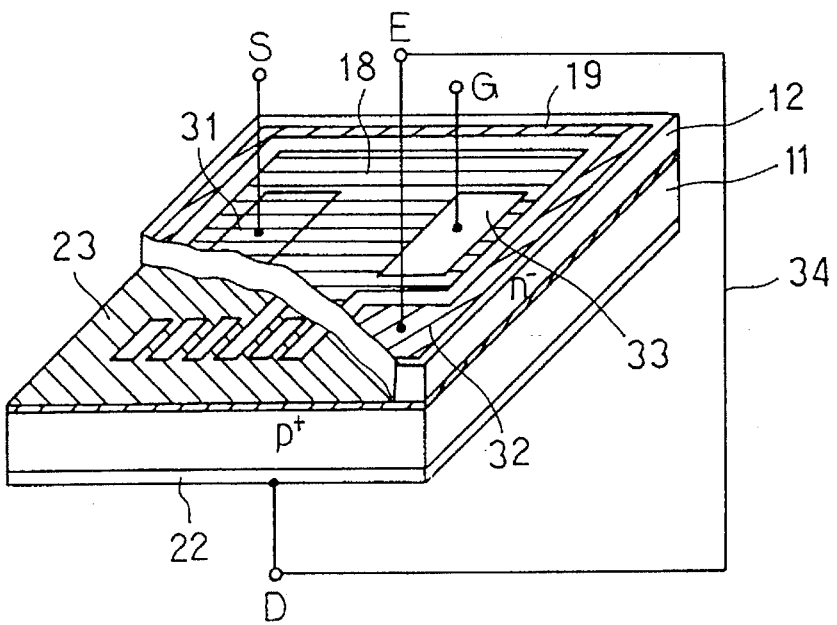
FIG. 10 is a perspective view, with portions broken away, showing a fourth embodiment of the IGBT according to the present invention.

The pattern of the $n^+$ embedded layer 23 may be modified to some extent. Although the first or second embodiment makes the $n^+$ embedded layer 23 into the form of a mesh or a lattice (defined by vertical and horizontal directions), FIGS. 9 and 10 show third and fourth embodiments, respectively, which use a striped pattern (aligned in one direction). It should be noted that the pattern may be modified if the object of the $n^+$ embedded layer 23 is accomplished. Further, it is not necessary to form the $n^+$ embedded layers 233 and 231 of FIG. 6 as to confront all of the marginal region 2, high-voltage withstand region 3, source terminal 31, reverse conducting electrode 19, and reverse conducting terminal 32 of the IGBT 1, and the same effect can be obtained even when the $n^+$ embedded layers 233 and 231 are formed in confronting relation to some of them.

Further, the $n^+$ embedded layer 23 is not necessarily formed as to spread up to below the $n^+$ layer 20 provided that the operating resistance of the reverse conducting diode composed of the $n^-$ layer 12 and p layer 13 can be made less enough. For example, the $n^+$ embedded layer 23 may be formed as to spread only up to below the high-voltage withstand region 3.

Further, the $n^+$ embedded layer 23 is not necessarily formed at the interface between the $n^-$ layer 12 and the $p^+$ layer 11, and the same effect can be obtained even when the $n^+$ embedded layer 23 is formed in the $n^-$ layer 12 in the vicinity of the interface.

Figure 11:
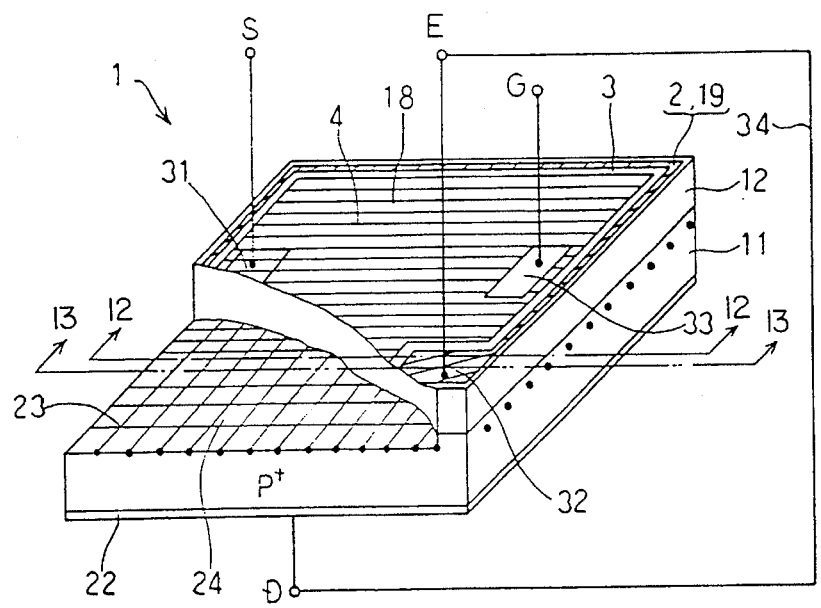
FIG. 11 is a perspective view, with portions broken away, showing a fifth embodiment of the IGBT according to the present invention.
Figure 12:
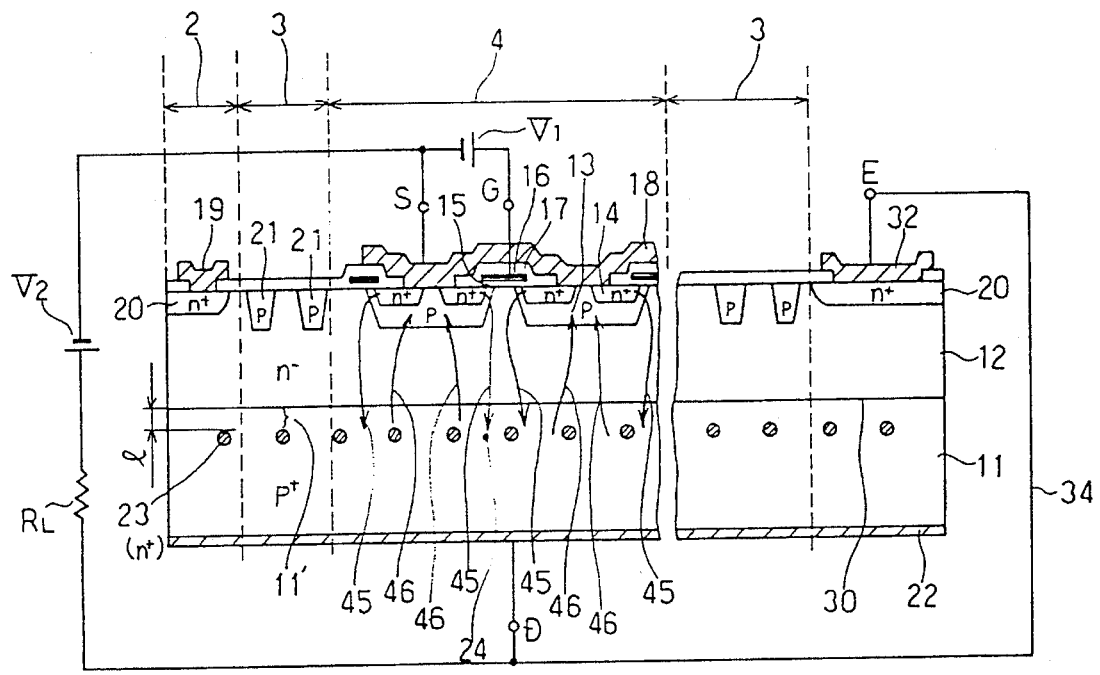
FIG. 12 is a sectional view taken along line A—A in FIG. 11.
Figure 13:
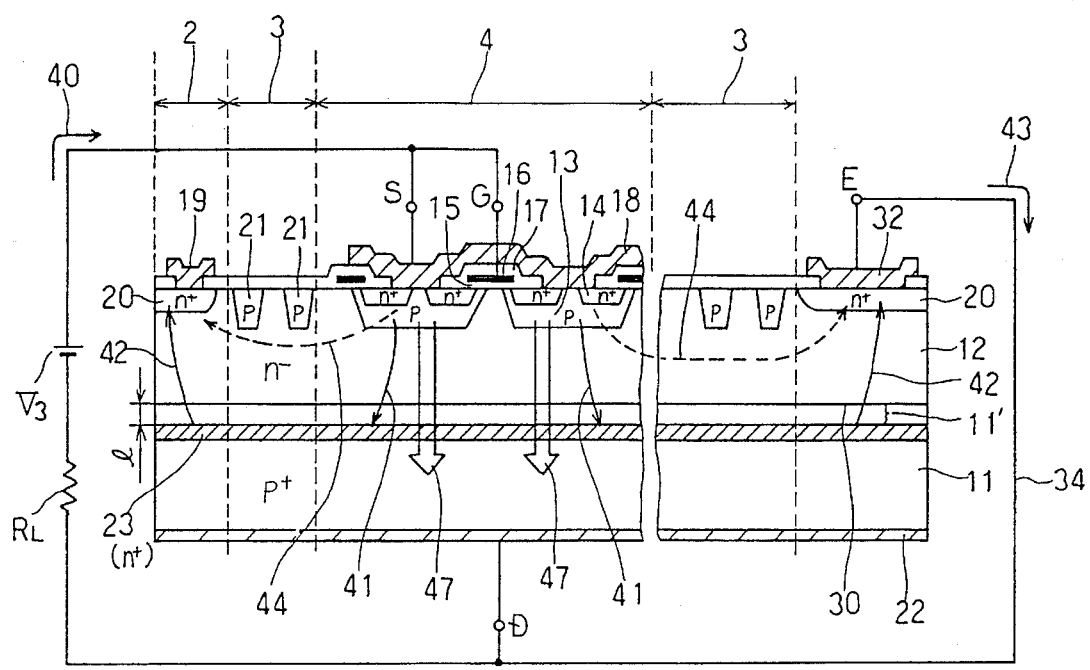
FIG. 13 is a sectional view taken along line B—B in FIG. 11.

A fifth embodiment of the present invention will be described with reference to FIGS. 11 through 13. FIG. 11 is a perspective view, with portions broken away, showing an IGBT according to the fifth embodiment of the present invention, and FIGS. 12 and 13 are sectional views taken along line A—A and line B—B, respectively, in FIG. 11. In these drawings, portions identical with those shown in FIGS. 1 through 3 are designated by the same reference numerals.

The fifth embodiment shown in FIGS. 11 through 13 differs from the first embodiment shown in FIGS. 1 through 3 in that the $n^+$ embedded layer 23 is formed in embedded form in the $p^+$ layer 11 to a depth of l from the interface (junction surface) 30 between the $p^+$ layer 11 and the $n^-$ layer 12. Specifically, in the process of manufacturing an IGBT 1 similar to that described in connection with the first embodiment, impurities are selectively diffused into the surface of the $p^+$ layer 11 (serving as the semiconductor substrate) to form the $n^+$ layer 23 of mesh pattern, and after the $n^-$ layer 12 is formed by the vapor growth technique, the wafer is subjected to heat treatment such that the $n^+$ embedded layer 23 is embedded in the $p^+$ layer 11. That is, the heat treatment for the wafer causes impurities within the $p^+$ layer 11 to diffuse into the $n^-$ layer 12 so that the position of the pn junction formed between the $p^+$ layer 11 and the $n^-$ layer 12 shifts towards the $n^-$ layer 12; as a result, the $n^+$ embedded layer 23 is embedded in the $p^+$ layer 11. In this step, the distance l from the junction surface 30 to the $n^+$ embedded layer 23 is regulated to smaller than the diffusion length of electrons by controlling the impurity concentration of a $p^+$ layer region 11' defined by the distance l.

The operation of the foregoing configuration will be described.

The reverse characteristic or reverse conducting function of the IGBT 1 shown in FIG. 11 will be described with reference to FIG. 13. To explain the operation of the reverse conducting state, in FIG. 13, a power source $V_3$ and a load resistor $R_L$ are connected between the source electrode 18 and the drain electrode 22 such that positive and negative potentials are applied to the source electrode 18 and the drain electrode 22, respectively.

In the foregoing configuration, the reverse conducting current flows through the reverse conducting diode composed of the p layer 13 and $n^-$ layer 12, and the reverse transistor whose emitter, base and collector correspond to the p layer 13, $n^-$ layer 12 and $p^+$ layer 11, respectively.

Specifically, in the reverse conducting diode, the reverse conducting current flows along the path indicated by the arrows 40 through 43 in FIG. 13, or through the path defined by the positive plate of the source $V_3$, source electrode 18, p layer 13, $n^-$ layer 12, $p^+$ layer region 11', $n^+$ embedded layer 23, $p^+$ layer region 11', $n^-$ layer 12, $n^+$ layer 20, reverse conducting electrode 19 and reverse conducting terminal 32, external conductor 34, drain electrode 22, load resistor $R_L$, and negative plate of the source $V_3$ in that order.

In the foregoing path, the forward characteristic of the reverse conducting diode of the IGBT 1 is determined by the electrical characteristic of the pn junction composed of the p layer 13 and n⁻ layer 12, and the operating resistance determined by the path defined by the p layer 13, n⁻ layer 12 (arrow 41), p⁺ layer region 11' (arrow 41), n⁺ embedded layer 23, p⁺ layer region 11' (arrow 42), n⁻ layer 12 (arrow 42), and n⁺ layer 20 in that order. That is, the value of operating resistance $R_1$ of the reverse conducting diode is expressed by $$R_1 = R_{10} + R_{11} + R_{12} + R_{13} + R_{14} \quad (3)$$

where $R_{10}$ is the value of resistance encountered when the current indicated by the arrow 41 flows across the n⁻ layer 12, $R_{11}$ is the value of resistance encountered when the current flows laterally across the n⁺ embedded layer 23, $R_{12}$ is the value of resistance encountered when the current indicated by the arrow 42 flows across the n⁻ layer 12, and they are identical with those included in Expression (1). Further, $R_{13}$ is the value of resistance encountered when the current indicated by the arrow 41 flows across p⁺ layer region 11', and $R_{14}$ is the value of resistance encountered when the current indicated by the arrow 42 flows across the p⁺ layer region 11'.

In Expression (3), the $R_{10}$, $R_{11}$ and $R_{12}$ are low enough as described in connection with Expression (1). In the foregoing path through which the reverse conducting current flows, since the width l of the p⁺ layer region 11' is set to smaller than the diffusion length of carriers, carriers can readily pass across the p⁺ layer region 11'; thus, the $R_{13}$ and $R_{14}$ are also low enough. Accordingly, the value of operating resistance $R_1$ of the reverse conducting diode expressed by Expression (3) becomes low enough.

On the other hand, in case the n⁺ embedded layer 23 is not provided, the reverse conducting current flows a long distance across the n⁻ layer 12 of high resistance, as indicated by the arrow 44 in FIG. 13; thus, the operating resistance of the reverse conducting diode becomes greater.

Now, in the reverse transistor, the reverse conducting current flows along the path indicated by the arrow 47 in FIG. 13, or through the path defined by the source electrode 18, p layer 13, n⁻ layer 12, (p⁺ layer region 11'), p⁺ layer 11, and drain electrode 22 in that order. That is, as described in connection with the first embodiment, the reverse conducting current flows as the collector current of the reverse transistor which is larger than the current flowing through the foregoing reverse conducting diode.

As described above, the presence of the n⁺ embedded layer 23 can decrease not only the operating resistance of the reverse conducting diode but also the operating resistance of the reverse transistor, and the operating resistance of the reverse conducting function can be made very low by the foregoing multiplicative effect. The electrical characteristic of the IGBT 1 in this embodiment is as illustrated in FIG. 4 (the characteristic curve Y) or similar to that of the first embodiment.

The forward characteristic of the IGBT 1 shown in FIG. 11 will be described with reference to FIG. 12. To explain the operation of the forward characteristic, in FIG. 12, a power source $V_2$ and a load resistor $R_L$ are connected between the drain electrode 22 and the source electrode 18, and another power source $V_1$ is connected between the gate electrode 16 and the source electrode 18.

In the foregoing configuration, electrons flow along the path indicated by the arrow 45, or through the path defined by the n⁺ layer 14, channel, n⁻ layer 12, (p⁺ layer region 11', mesh portion 24 of the n⁺ embedded layer 23), and p⁺ layer 11 in that order; on the other hand, positive holes flow along the path indicated by the arrow 46, or through the path defined by the p⁺ layer 11, (mesh portion 24 of the n⁺ embedded layer 23, p⁺ layer region 11'), n⁻ layer 12, and p layer 13 in that order. That is, in this embodiment, although the n⁺ embedded layer 23 is formed, electrons and positive holes can pass through the mesh portion 24 of the n⁺ embedded layer 23, carriers can be given and received through the whole surface of the junction surface 30 between the p⁺ layer 11 (p⁺ layer region 11') and the n⁻ layer 12, and the n⁺ embedded layer 23 does not impede the flowing of electrons and positive holes, whereby a high withstand voltage and a low on-resistance can be attained, as in the prior art with no inclusion of the n⁺ embedded layer 23.

Further, the IGBT 1 shown in FIG. 11 has the reverse conducting function built therein and can shorten the turn-off time. The reason will be described. As described in connection with the first embodiment, the equivalent circuit of the IGBT 1 is as shown in FIG. 5, and the turn-off time of the IGBT is determined by the turn-off time of the pnp transistor 50. The emitter E of the pnp transistor 50 corresponds to the p⁺ layer 11 shown in FIGS. 11 through 13, the base B to the n⁻ layer 12, and the collector C to the D layer 13. In this embodiment, the value of resistance $R_{53}$ of an adequate resistor 53 being connected between the base B and the emitter E in order to remove excessive charge accumulated in the base B to thereby shorten the turn-off time is expressed by $$R_{53} = R_{11} + R_{12} + R_{13} + R_{14} \quad (4)$$

where $R_{11}$ is the value of resistance encountered when the current flows laterally across the n⁺ embedded layer 23, $R_{12}$ is the value of resistance encountered when the current flows across the n⁻ layer 12, $R_{13}$ and $R_{14}$ are resistances encountered when the current flows across the p⁺ layer region 11', and they are identical with the $R_{11}$ to $R_{14}$ included in Expression (3).

As will be clear from FIGS. 12 and 13, the n⁺ embedded layer 23 spreads enough in the form of a mesh in parallel to the junction surface 30. Since the width l of the p⁺ layer region 11' is set to smaller than the diffusion length of carriers, carriers can readily go across the p⁺ layer region 11'; thus, the value of resistance $R_{13}$ and $R_{14}$ are low enough. Also, the $R_{11}$ and $R_{12}$ included in Expression (4) are low enough as described above. Accordingly, the $R_{53}$ can be made low, the turn-off time of the pnp transistor 50 can be shortened, and the turn-off time of the IGBT 1 can be shortened.

As described above, in this embodiment, the n⁺ embedded layer 23 is made in the form of a mesh and formed at a position spaced the distance l (smaller than the diffusion length of carriers) from the junction surface 30 towards the p⁺ layer 11; thus, the area of the junction surface 30 between the p⁺ layer 11 and the n⁻ layer 12 little decreases. Accordingly, the turn-off time can be shortened without degrading the efficiency of injection of positive holes from the p⁺ layer 11 or increasing the on-resistance, and there is realized the configuration having the reverse conducting function built therein.

In the fifth embodiment, the turn-off time can be controlled by changing the distance l.

The process of forming the n⁺ embedded layer 23 in the p⁺ layer 11 at the position spaced the distance l from the junction surface 30 can be carried out by the use of the foregoing heat treatment, by forming the p⁺ layer by the vapor growth technique after forming the n⁺ embedded layer 23 by the diffusion technique, by the use of the direct wafer joining technique, etc.

Further, in the fifth embodiment wherein the n⁺ embedded layer 23 is formed in the p⁺ layer 11, the pattern of the n⁺ embedded layer 23 may be modified, as in the foregoing second, third and fourth embodiments, if the object of the n⁺ embedded layer 23 is accomplished.

In all the embodiments, the high-voltage withstand region 3 is not necessarily formed depending on the service condition of the IGBT.

Although all the embodiments use the p type and n type as the first conduction type and second conduction type, respectively, the present invention is valid even when the opposite conduction type is used.

INDUSTRIAL APPLICABILITY

As described above, the insulated gate bipolar transistor according to the present invention is usable as a power element for which high withstand voltage and low on-resistance are required, and when used as a power switching element of power converting units such as inverters for driving motors in PWM (pulse width modulation) control mode, it is very effective because its built-in reverse conducting function can circulate the motor current.

What is claimed is:

1. An insulated gate bipolar transistor with a reverse conducting function comprising:

a first semiconductor layer of a first conduction type;

a second semiconductor layer of a second conduction type formed in contact with the first semiconductor layer at a bottom surface therebetween;

a third semiconductor region of the first conduction type formed in the second semiconductor layer and having a junction portion extending to a top surface of said second semiconductor layer;

a fourth semiconductor region of the second conduction type formed in the third semiconductor region and having a junction portion extending to said top surface of said second semiconductor layer;

an insulated gate electrode formed at least over the third semiconductor region junction portion laterally extending between the fourth semiconductor region junction portion and a non-diffused potion of said second semiconductor layer which extends to the top surface thereof;

a source electrode in contact with both the third semiconductor region and the fourth semiconductor region;

a drain electrode for supplying a drain current through the first semiconductor layer;

a fifth semiconductor region of the second conduction type which is electrically connected to the drain electrode via an external conductor, and formed within the second semiconductor layer having a junction portion extending to said top surface of the second semiconductor layer so as to pass therethrough a reverse conducting current opposite in direction to the drain current;

a sixth semiconductor region of the second conduction type formed partially at or near the bottom surface between the first semiconductor layer and the second semiconductor layer, said sixth semiconductor region having an impurity concentration higher than that of the second semiconductor layer and formed into a given pattern to reduce an electric resistance on carriers passing between the fifth semiconductor region and a portion of the second semiconductor layer at a distance from the fifth semiconductor region, said sixth semiconductor region allowing the carriers to pass across the bottom surface between the first semiconductor layer and the second semiconductor layer; and an electrically isolated high-voltage withstand region provided between said fifth semiconductor region and an element region, said element region including at least said second semiconductor layer, said third semiconductor region and said fourth semiconductor region, said high-voltage withstand region providing a high voltage withstand barrier against high voltages produced in an end area of said element region, said sixth semiconductor region being provided below at least said element region and said high-voltage withstand region, and said given pattern of said sixth semiconductor region being such that at least a part of said sixth semiconductor region extends continuously from a portion below said element region to a portion below said high-voltage withstand region.

2. An insulated gate bipolar transistor according to claim 1, wherein the sixth semiconductor region pattern provides contact portions and non-contact portions between the first and second semiconductor layers, said non-contact portions for passing the carriers therethrough when said transistor is active.

3. An insulated gate bipolar transistor according to claim 2, wherein the sixth semiconductor region pattern is a mesh pattern or a striped pattern and is formed at least relative to a region confronting the third semiconductor region.

4. An insulated gate bipolar transistor according to claim 1, wherein the sixth semiconductor region pattern is formed entirely in the first semiconductor layer at a close distance from the bottom surface of the second semiconductor layer, the distance being smaller than a diffusion length of minority carriers in the first semiconductor layer such that majority carriers pass between the first and second semiconductor layers.

5. An insulated gate bipolar transistor according to claim 4, wherein the sixth semiconductor region pattern is a mesh pattern or a striped pattern and is formed at least relative to a region confronting the third semiconductor region.

6. An insulated gate bipolar transistor according to claim 1, wherein the sixth semiconductor region pattern is a mesh pattern or a striped pattern and is formed at least relative to a region confronting the third semiconductor region.

7. An insulated gate bipolar transistor according to claim 6, wherein the fifth semiconductor region is formed along a peripheral surface portion of the second semiconductor layer.

8. An insulated gate bipolar transistor according to claim 7, wherein the sixth semiconductor region pattern is formed so as to spread up to a region confronting the fifth semiconductor region formed along the peripheral surface portion of the second semiconductor layer.

9. An insulated gate bipolar transistor according to claim 7, wherein the sixth semiconductor region pattern is p⁺ layer 11 (where the n layer 23 is present) as to formed so as to spread up to a region confronting both the fifth semiconductor region and the high-voltage withstand region.

10. An insulated gate bipolar transistor according to claim 9, wherein said high-voltage withstand region includes a guard ring.

11. An insulated gate bipolar transistor according to claim 1, wherein the fifth semiconductor region is formed along a peripheral surface portion of the second semiconductor layer.

12. An insulated gate bipolar transistor according to claim 11, wherein the sixth semiconductor region pattern is formed so as to spread up to a region confronting the fifth semiconductor region formed along the peripheral surface portion of the second semiconductor layer.

13. An insulated gate bipolar transistor according to claim 12, wherein the fifth semiconductor region totally confronts the sixth semiconductor region at a corresponding overlapping portion thereof.

14. An insulated gate bipolar transistor according to claim 1, wherein said high-voltage withstand region includes a guard ring.

15. An insulated gate bipolar transistor according to claim 1, wherein said sixth semiconductor region is also provided below said fifth semiconductor region.

16. An insulated gate bipolar transistor with a reverse conducting function comprising:

a first semiconductor layer of a first conduction type;

a second semiconductor layer of a second conduction type formed in contact with the first semiconductor layer at a bottom surface therebetween;

a third semiconductor region of the first conduction type formed in the second semiconductor layer and having a junction portion extending to a top surface of said second semiconductor layer;

a fourth semiconductor region of the second conduction type formed in the third semiconductor region and having a junction portion extending to said top surface of said second semiconductor layer;

an insulated gate electrode formed at least over the third semiconductor region junction portion laterally extending between the fourth semiconductor region junction portion and a non-diffused potion of said second semiconductor layer which extends to the top surface thereof;

a source electrode in contact with both the third semiconductor region and the fourth semiconductor region;

a drain electrode for supplying a drain current through the first semiconductor layer;

a fifth semiconductor region of the second conduction type which is electrically connected to the drain electrode via an external conductor, and formed within the second semiconductor layer having a junction portion extending to said top surface of the second semiconductor layer so as to pass therethrough a reverse conducting current opposite in direction to the drain current;

a sixth semiconductor region of the second conduction type formed partially at or near the bottom surface between the first semiconductor layer and the second semiconductor layer, said sixth semiconductor region having an impurity concentration higher than that of the second semiconductor layer and formed into a given pattern to reduce an electric resistance on carriers passing between the fifth semiconductor region and a portion of the second semiconductor layer at a distance from the fifth semiconductor region, said sixth semiconductor region allowing the carriers to pass across the bottom surface between the first semiconductor layer and the second semiconductor layer; and an electrically isolated high-voltage withstand region provided between said fifth semiconductor region and an element region, said element region including at least said second semiconductor layer, said third semiconductor region and said fourth semiconductor region, said high-voltage withstand region providing a high voltage withstand barrier against high voltages produced in an end area of said element region, said sixth semiconductor region being provided below at least said element region and said high-voltage withstand region, and said given pattern of said sixth semiconductor region being such that at least a part of said sixth semiconductor region extends continuously from a portion below said element region to a portion below said high-voltage withstand region.

17. An insulated gate bipolar transistor according to claim 16, wherein the sixth semiconductor region pattern provides contact portions and non-contact portions between the first and second semiconductor layers, said non-contact portions for passing the carriers therethrough when said transistor is active.

18. An insulated gate bipolar transistor according to claim 16, wherein the sixth semiconductor region pattern is formed entirely in the first semiconductor layer at a close distance from the bottom surface of the second semiconductor layer, the distance being smaller than a diffusion length of minority carriers in the first semiconductor layer such that majority carriers pass between the first and second semiconductor layers.

19. An insulated gate bipolar transistor according to claim 16, wherein the sixth semiconductor region pattern is a mesh pattern or a striped pattern and is formed at least relative to a region confronting the third semiconductor region.

20. An insulated gate bipolar transistor according to claim 16, wherein the fifth semiconductor region is formed along a peripheral surface portion of the second semiconductor layer.

21. An insulated gate bipolar transistor according to claim 20, wherein the sixth semiconductor region pattern is formed so as to spread up to a region confronting the fifth semiconductor region formed along the peripheral surface portion of the second semiconductor layer.

22. An insulated gate bipolar transistor according to claim 21, wherein the fifth semiconductor region totally confronts the sixth semiconductor region at a corresponding overlapping portion thereof.

23. An insulated gate bipolar transistor according to claim 16, wherein said high-voltage withstand region includes a guard ring.

24. An insulated gate bipolar transistor according to claim 16, wherein said sixth semiconductor region is also provided below said fifth semiconductor region.

25. An insulated gate bipolar transistor with a reverse conducting function comprising:

a first semiconductor layer of a first conductivity type;

a second semiconductor layer of a second conductivity type which is in contact with the first semiconductor layer;

a third semiconductor region of the first conductivity type which is formed in the second semiconductor layer such that junction portion thereof terminates at a surface of the second semiconductor layer;

a fourth semiconductor region of the second conductivity type which is formed in the third semiconductor region such that junction portion thereof terminates at a surface of the third semiconductor region;

a gate electrode formed on at least a channel region defined in the surface of the third semiconductor region between the second semiconductor layer and the fourth semiconductor region with a gate insulating film interposed therebetween;

a source electrode contacting with both the third semiconductor region and the fourth semiconductor region;

a drain electrode for supply of a drain current through the first semiconductor layer;

a fifth semiconductor region of the second conductivity type which is electrically connected to the drain electrode and formed in a given surface region within the second semiconductor layer, so as to pass therethrough a reverse conducting current opposite in direction to the drain current;

a high-voltage withstand region for ensuring a high withstand voltage provided between the fifth semiconductor region and an element region, the element region including at least the third semiconductor region, the fourth semiconductor region and the gate electrode; and a sixth semiconductor region of the second conductivity type which is formed at or in the vicinity of the interface between the first semiconductor layer and the second semiconductor layer and is provided below at least the element region and the high-voltage withstand region, the sixth semiconductor region having an impurity concentration higher than that of the second semiconductor layer and formed into a given pattern having an extending part extending from the element region to the high-voltage withstand region and windows which are located at least below the element region to allow majority carriers in the first semiconductor layer to pass therethrough, whereby an electric resistance on carriers passing between the fifth semiconductor region and a portion of the second semiconductor layer at a distance from the fifth semiconductor region is reduced but carriers injection between the first semiconductor layer and the second semiconductor layer is allowed.

26. An insulated gate bipolar transistor according to claim 25, wherein the given pattern of the sixth semiconductor region provides contact portions and non-contact portions between the first and second semiconductor layers, whereby the contact portions allows the carriers injection between the first semiconductor layer and the second semiconductor layer.

27. An insulated gate bipolar transistor according to claim 25, wherein the sixth semiconductor region is entirely formed in the first semiconductor layer at a close distance from the interface between the first semiconductor layer and the second semiconductor layer, the close distance being smaller than a diffusion length of minority carriers in the first semiconductor layer.

28. An insulated gate bipolar transistor according to claim 25, wherein the given pattern is a mesh pattern at least below the third semiconductor region.

29. An insulated gate bipolar transistor according to claim 25, wherein the given pattern is a strip pattern at least below the third semiconductor region.

30. An insulated gate bipolar transistor according to claim 25, wherein the fifth semiconductor region is formed along a peripheral surface portion of the second semiconductor layer.

31. An insulated gate bipolar transistor according to claim 25, wherein the sixth semiconductor region is disposed so as to extend from the element region to a region which is below the fifth semiconductor region.

32. An insulated gate bipolar transistor according to claim 31, wherein the region below the fifth semiconductor region is thoroughly covered with the sixth semiconductor region.

33. An insulated gate bipolar transistor according to claim 31, wherein the sixth semiconductor region thoroughly covers a region below both the fifth semiconductor region and the high-voltage withstand region.

34. An insulated gate bipolar transistor according to claim 25, wherein said high-voltage withstand region includes a guard ring.

35. An insulated gate bipolar transistor according to claim 25, wherein the given pattern is a mesh pattern at least below the element region.

36. An insulated gate bipolar transistor according to claim 25, wherein the given pattern is a strip pattern at least below the element region.

37. An insulated gate bipolar transistor according to claim 25, wherein the fifth semiconductor region is formed in a peripheral region which surrounds the element region with the high-voltage withstand region disposed therebetween.

\* \* \* \* \*